(12) United States Patent
Kang

(10) Patent No.: US 8,383,463 B2
(45) Date of Patent: Feb. 26, 2013

(54) SEMICONDUCTOR PACKAGE HAVING AN ANTENNA WITH REDUCED AREA AND METHOD FOR FABRICATING THE SAME

(75) Inventor: Tae Min Kang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/186,713

(22) Filed: Jul. 20, 2011

(65) Prior Publication Data

US 2011/0275181 A1 Nov. 10, 2011

Related U.S. Application Data

(62) Division of application No. 12/495,029, filed on Jun. 30, 2009, now Pat. No. 8,008,754.

(30) Foreign Application Priority Data

Dec. 10, 2008 (KR) .................. 10-2008-0125466
Jun. 16, 2009 (KR) .................. 10-2009-0053185

(51) Int. Cl.
*H01L 21/00* (2006.01)
(52) U.S. Cl. ................. 438/127; 257/659; 257/E21.502
(58) Field of Classification Search .................. 438/127; 257/659, E21.502
See application file for complete search history.

(56) References Cited

U.S. PATENT DOCUMENTS

| 5,138,263 | A * | 8/1992 | Towle ......................... 324/338 |
| 5,721,021 | A * | 2/1998 | Tobe et al. .................... 427/570 |
| 6,853,087 | B2 * | 2/2005 | Neuhaus et al. ............... 257/778 |
| 2006/0055531 | A1 * | 3/2006 | Cook et al. ............... 340/539.22 |

FOREIGN PATENT DOCUMENTS

| JP | 2002-359319 A | 12/2002 |
| KR | 1020020036039 A | 5/2002 |
| KR | 1020030012994 A | 2/2003 |
| KR | 1020050083323 A | 8/2005 |
| KR | 1020080062909 A | 7/2008 |
| WO | 03/017096 A2 | 2/2003 |

OTHER PUBLICATIONS

USPTO OA mailed Feb. 1, 2011 in connection with U.S. Appl. No. 12/495,029.
USPTO OA mailed Aug. 31, 2010 in connection with U.S. Appl. No. 12/495,029.
USPTO NOA mailed Apr. 27, 2011 in connection with U.S. Appl. No. 12/495,029.

* cited by examiner

*Primary Examiner* — Bradley K Smith
*Assistant Examiner* — Timor Karimy
(74) *Attorney, Agent, or Firm* — Ladas & Parry LLP

(57) ABSTRACT

A semiconductor package includes an electromagnetic shielding member for shielding electromagnetic waves. An antenna is disposed on an upper face of the electromagnetic shielding member and includes an antenna part with a plurality of conductive particles electrically connected with each other and an insulation part disposed on the upper face of the electromagnetic shielding member and insulating the antenna part. Ball lands are disposed on the electromagnetic shielding member and are electrically connected with the antenna part. A Radio Frequency Identification (RFID) chip is electrically connected to the ball lands.

4 Claims, 14 Drawing Sheets

SEMICONDUCTOR PACKAGE HAVING AN ANTENNA WITH REDUCED AREA AND METHOD FOR FABRICATING THE SAME

CROSS-REFERENCE TO RELATED APPLICATIONS

The present application claims priority to Korean patent application number 10-2008-0125466 filed on Dec. 10, 2008 and 10-2009-053185 filed on Jun. 16, 2009 which are incorporated herein by reference in their entireties.

BACKGROUND OF THE INVENTION

The present invention relates generally to a semiconductor package and a method for fabricating the same, and more particularly to a semiconductor package having an antenna with a reduced area and a method of manufacturing the same.

Recent developments in semiconductors include semiconductor chips capable of storing and processing massive amounts of data and a semiconductor package including the semiconductor chip.

One such semiconductor package is a Radio Frequency Identification (RFID) system, which is a next generation identification system capable of managing various individuals such as foods, animals, and objects through a semiconductor chip and wireless technology. The RFID system primarily includes three elements, i.e., an antenna, a transceiver, and a tag or a transponder. Recently, the RFID system is largely used in an entrance control system or an electronic payment system.

The antenna is an important element of the RFID system that receives a signal from an external device to the RFID system and is formed by a metal thin film of a foil shape or a plating process.

When the antenna of the RFID system is formed in the foil shape miniaturization of the system is difficult and since the antenna has a small adhesion area an adhesive property of the antenna is poor. When the antenna of the RFID system is formed in the plating process, fabrication cost of the RFID system is substantially increased because the plating process requires a complex fabrication process.

SUMMARY OF THE INVENTION

Embodiments of the present invention include a semiconductor package having an antenna capable of achieving miniaturization as well as simplifying a fabrication process thereof so as to significantly reduce a fabrication cost.

Also, embodiments of the present invention include a method for fabricating the semiconductor package.

In one embodiment, a semiconductor package includes an electromagnetic shielding member for shielding electromagnetic waves; an antenna disposed on an upper face of the electromagnetic shielding member and having an antenna part with a plurality of conductive particles electrically connected with each other along the electromagnetic shielding member and an insulation part disposed on the upper face and insulating the antenna part; ball lands disposed on the electromagnetic shielding member and electrically connected with the antenna part; and a Radio Frequency Identification (RFID) chip electrically connected with the ball lands.

The antenna is disposed in a spiral shape or a closed loop shape along an edge of the upper face of the electromagnetic shielding member.

The antenna intersects with another portion thereof at least one time on the electromagnetic shielding member.

The semiconductor package may further include a semiconductor chip on which a lower face of the electromagnetic shielding member opposite to the upper face of the electromagnetic shielding member is disposed; a substrate electrically connected with the semiconductor chip; and a molding member for molding the RFID chip and the semiconductor chip.

The electromagnetic shielding member includes openings and the semiconductor chip corresponding to the opening includes bonding pads electrically connected with the substrate.

The electromagnetic shielding member exposes at least one edge of the semiconductor chip and bonding pads electrically connected with the substrate are disposed along the edge.

The semiconductor package may further include a substrate on which a lower face of the electromagnetic shielding member opposite to the upper face of the electromagnetic shielding member is disposed; a semiconductor chip disposed on the substrate and electrically connected with the substrate; and a molding member for molding the RFID chip and the semiconductor chip.

The electromagnetic member is disposed on a portion of the substrate which is adjacent to the semiconductor chip.

The electromagnetic member is disposed on the entire area of the substrate and the electromagnetic member has an opening for exposing the semiconductor chip.

The semiconductor package may further include bonding pads disposed in the semiconductor chip which faces to the substrate; connection pads disposed on the substrate which faces to the bonding pads; and bumps for electrically connecting the bonding pads and the connection pads.

The semiconductor package may further include a wafer level semiconductor chip including a first face over which a lower face of the electromagnetic shielding member opposite to the upper face of the electromagnetic shielding member is disposed, a second face which is opposite to the first face, bonding pads disposed on the second face, redistributions electrically connected to the respective bonding pads and an insulation film disposed on the second face and having openings for exposing some portion of the respective redistributions.

The semiconductor package may further include a molding member for molding the RFID chip and the electromagnetic shielding member.

Each conductive particle has a first polarity and a second polarity which is opposite to the first polarity.

The first polarity has (+) polarity and the second polarity has (−) polarity.

Alternatively, the first polarity has N polarity and the second polarity has S polarity.

In another embodiment, a method for fabricating a semiconductor package includes preparing an electromagnetic shielding member for shielding electromagnetic waves; forming ball is lands over the electromagnetic shielding member; forming a preliminary antenna connecting the ball lands and including conductive polarized particles respectively having different polarities and flowable insulation material over an upper face of the electromagnetic shielding member; electrically connecting the conductive polarized particles within the flowable insulation material by applying power having different polarities to the respective ball lands; curing the flowable insulation material; and electrically connecting terminals of a RFID chip to the respective ball lands.

Each conductive polarized particle has (+) polarity and (−) polarity.

Alternatively, each conductive polarized particle has N polarity and S polarity.

The method may further include, after the step of electrically connecting the terminals of the RFID chip to the respective ball lands, attaching the electromagnetic shielding member to the semiconductor package; and molding the RFID chip of the electromagnetic shielding member and the semiconductor package with a molding member.

In the step of attaching the electromagnetic shielding member to the semiconductor package, the electromagnetic shielding member is attached onto the semiconductor chip included in the semiconductor package.

In the step of attaching the electromagnetic shielding is member to the semiconductor package, the electromagnetic shielding member is attached onto a substrate to which the semiconductor chip included in the semiconductor package is attached.

DESCRIPTION OF SPECIFIC EMBODIMENTS

Figure 1:
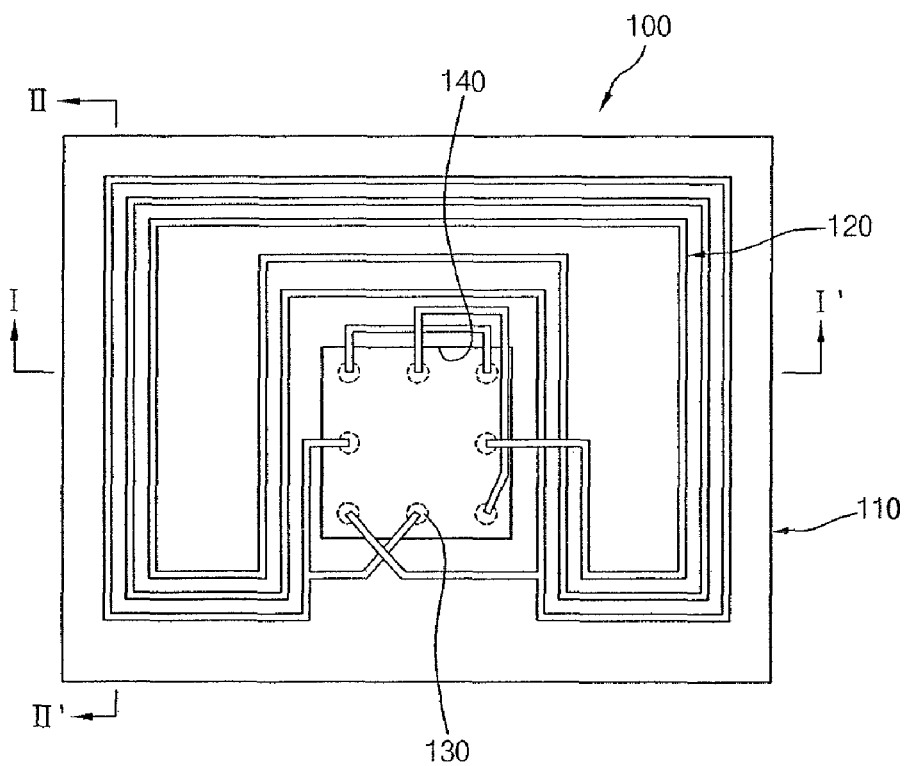
FIG. 1 is a plan view showing a semiconductor package in accordance with an embodiment of the present invention.
Figure 2:
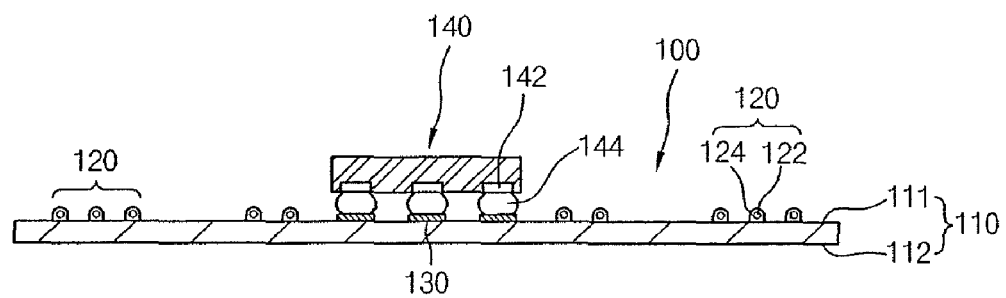
FIG. 2 is a cross-sectional view of the semiconductor package of FIG. 1 taken along a line I-I'.
Figure 3:
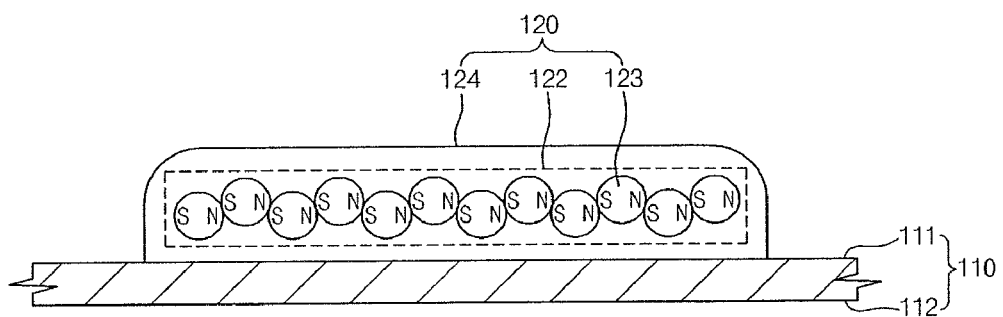
FIG. 3 is a cross-sectional view of the semiconductor package of FIG. 1 taken along a line II-II'.

FIG. 1 is a plan view showing a semiconductor package in accordance with an embodiment of the present invention. FIG. 2 is a cross-sectional view taken along a line I-I' in FIG. 1. FIG. 3 is a cross-sectional view taken along a line II-II' in FIG. 1.

Referring to FIG. 1, a semiconductor package 100 includes an electromagnetic shielding member 110, an antenna 120, ball lands 130, and an RFID chip 140.

The electromagnetic shielding member 110 may be formed to have, for example, the shape of a rectangular plate with a thin thickness. The electromagnetic shielding member 110 contains an insulation material for preventing electromagnetic waves to pass therethrough. As shown in FIG. 2, the electromagnetic shielding member 110 includes an upper face 111 and a lower face 112, which is opposite to the upper face 111.

According to an embodiment of the present invention, the antenna 120 may be disposed on the upper face 111 of the electromagnetic shielding member 110, although it is to be understood that this is by way of example and the present invention is not limited in this way. The antenna 120 has a linear shape when viewed from above. The antenna 120 having the linear shape is disposed on the upper face 111 of the electromagnetic shielding member 110 along an edge of the electromagnetic shielding member 110. According to an embodiment of the present invention the antenna 120 may be formed in a spiral shape along an edge of the upper face 111 of the electromagnetic shielding member 110 for enhancing a signal receiving performance. Alternatively, the antenna 120 can be formed in a closed loop shape along the edge of the upper face 111 of the electromagnetic shielding member 110.

Referring to FIGS. 2 and 3, the antenna includes an antenna part 122 and an insulation part 124.

The antenna part 122 includes a plurality of conductive particles 123 that are electrically connected along a direction parallel to the upper face 111 of the electromagnetic shielding member 110.

In the present embodiment, each conductive particle 123 has a first polarity and a second polarity, which is opposite to the first polarity. The first polarity is formed at a first side of the conductive particle 123 and the second polarity is formed at the a second side of the conductive particle, 123 which is opposite to the first side.

Figure 4:
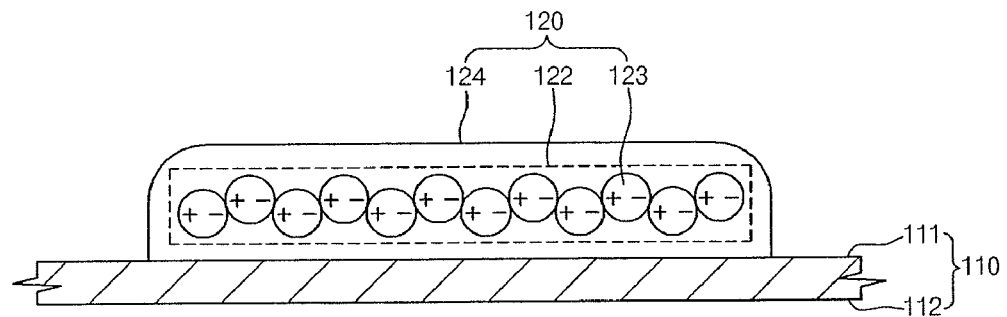
FIG. 4 is a cross-sectional view showing another example of an antenna of the semiconductor package in accordance with an embodiment of the present invention.

The first polarities and the second polarities of the plurality of the conductive particles 123 are alternately disposed. In the present embodiment, the first polarity can be, for example, (+) polarity, and the second polarity can be, for example, (−) polarity. Alternatively, as shown in FIG. 4, the first polarity can be, for example, N polarity, and the second polarity can be, for example, S polarity.

The insulation part 124 insulates the plurality of electrically connected conductive particles 123. The plurality of the conductive particles 123 are disposed within the insulation part 124, and the insulation part 124 serves as an insulation coating.

In the present embodiment, when the antenna 120 includes the antenna part 122 having the plurality of the conductive particles 123 and the insulation part 124 surrounding the antenna part 122, a portion of the antenna 120 can intersect with other portions of the antenna 120 on the upper face of the electromagnetic shielding member 110 because the antenna part 122 is insulated by the insulation part 124.

When the antenna is formed conventionally of a metal thin film or a plated film, one or more of the antennas cannot intersect with each other and thus the fabrication process is complex and the size of the antenna is increased. However, in the present invention, since portions of the antennas 120 can intersect with each other over the electromagnetic shielding member 110, the fabrication process of the antenna is simple and the size of the antenna 120 can be significantly reduced as compared to the convention art.

As shown in FIG. 2, the ball lands 130 are disposed on the upper face 111 of the electromagnetic shielding member 110. The ball lands 130 are disposed in positions corresponding to the positions of the bonding pads of the RFID chip 140, which will be described in detail below. In the present embodiment, the ball lands 130 have an island shape.

Each ball land 130 is connected to the antenna part 122 of the antenna 120 and each ball land 130 may further include a connection part (not shown), which is protruded from the ball land 130 along the upper face 111 of the electromagnetic shielding is member 110, for the electric connection with the antenna part 122. The connection part prevents the reduction in contact area between a connection member of the RFID chip 140 and the ball land 130 due to the attachment of the antenna to the ball land 130.

The RFID chip 140 includes a bonding pad 142 and a connection member 144. The bonding pad 142 is disposed at substantially the same position as the ball land 130, and the connection member 144 electrically connects the bonding pad 142 and the ball land 130. In the present embodiment, the connection member 144 may be a solder ball or a bump, although it is to be understood that this is by way of example and the present invention is not limited in this way.

Figure 5:
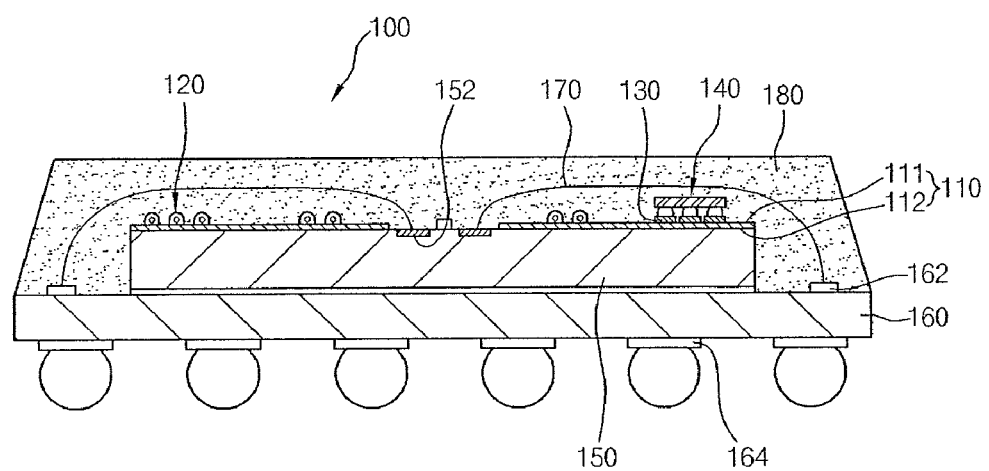
FIG. 5 is a cross-sectional view showing a semiconductor package in accordance with another embodiment of the present invention.

FIG. 5 is a cross-sectional view showing a semiconductor package in accordance with another embodiment of the present invention.

Referring to FIG. 5, the semiconductor package 100 includes the electromagnetic shielding member 110, the antenna 120, the ball lands 130, the RFID chip 140, a semiconductor chip 150, a substrate 160, a conductive wire 170, and a molding to member 180. In the present embodiment, the antenna 120, the ball land 130 and the RFID chip 140, have substantially the same structure as those described above with reference to FIGS. 1 through 4 and thus will not be described in detail again. Further, identical numerals and names will be given to the identical parts.

The electromagnetic shielding member 110 contains an insulation material capable of shielding the electromagnetic waves and, according to the present embodiment the electromagnetic shielding member has the shape of a rectangular parallelepiped with a thin thickness.

In the present embodiment, a plurality of openings arranged in two rows is defined in a middle portion of the electromagnetic shielding member 110. The antenna 120 is electrically connected to the ball land 130 disposed on the upper face 111 of the electromagnetic shielding member 110, and each ball land 130 is electrically connected to the RFID chip 140.

The semiconductor chip 150 has, for example, a rectangular parallelepiped shape, and bonding pads 152 are disposed on an upper face of the semiconductor chip 150 having a rectangular parallelepiped shape. For example, the bonding pads 152 are formed at positions corresponding to the openings formed in the middle portion of the electromagnetic shielding member 110.

The lower face 112 of the electromagnetic shielding member 110 is disposed on the upper face of the semiconductor chip 150. In the present embodiment, an adhesive member may be interposed between the lower face 112 of the electromagnetic shielding member 110 and the upper face of the semiconductor chip 150. The bonding pads 152 of the semiconductor chip 150 are exposed to the outside by the openings formed in the is electromagnetic shielding member 110.

As shown in FIG. 5, the substrate 160 may be formed to have the shape of a plate. Connection pads 162 are disposed on an upper face of the substrate 160 and a ball land pattern 164 is formed on a lower face of the substrate 160 which is opposite the upper face and electrically connected with the connection pad 162. The lower face of the semiconductor chip 150 is attached onto the upper face of the substrate 160.

The conductive wire 170 electrically connects corresponding bonding pads 152 of the semiconductor chip 150 and connection pads 162 of the substrate 160.

The molding member 180 covers the semiconductor chip 150, the electromagnetic member 110, and the RFID chip 140. The molding member 180 may contain, for example, a molding resin such as an epoxy resin. It should be understood that this is by way of example, and the molding member 180 is not limited in this way.

Figure 6:
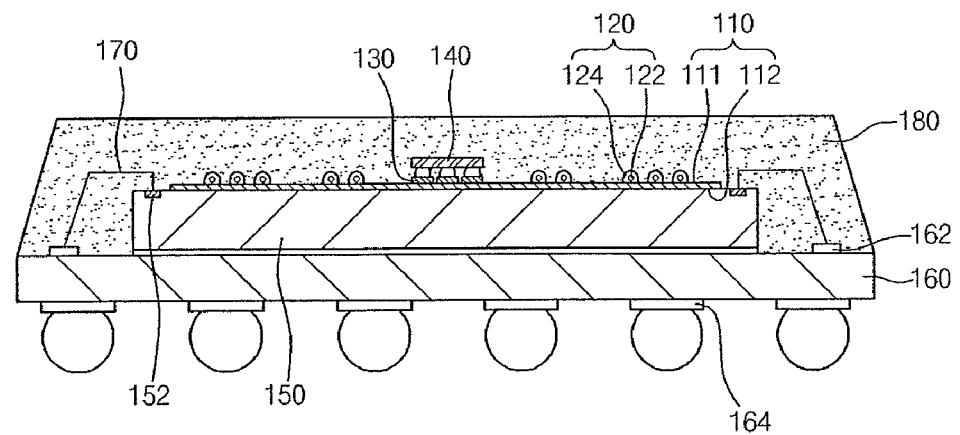
FIG. 6 is a cross-sectional view showing a semiconductor package in accordance with yet another embodiment of the present invention.

FIG. 6 is a cross-sectional view showing a semiconductor package in accordance with yet another embodiment of the present to invention.

Referring to FIG. 6, the semiconductor package 100 includes the electromagnetic shielding member 110, the antenna 120, the ball lands 130, the RFID chip 140, the semiconductor chip 150, the substrate 160, the conductive wire 170, and the molding member 180. In the present embodiment, the electromagnetic shielding member 110, the antenna 120, the ball land 130, and the RFID chip 140 have substantially the same structure as those described above with reference to FIGS. 1 through 4 and thus will not be described again. Further, identical numerals and names will be given to the identical parts.

The semiconductor chip 150 has, for example, a rectangular parallelepiped shape, and bonding pads 152 are disposed on an upper face of the semiconductor chip 150. For example, the bonding pads 152 are disposed along an edge of the upper face of the semiconductor chip 150. In the present embodiment, the bonding pads 152 are be disposed along two opposing edges of the upper face of the semiconductor chip 150. Alternatively, the bonding pads 152 may be disposed in other configurations, for example along one edge of the upper face of the semiconductor chip 150.

The lower face 112 of the electromagnetic shielding member 110 is disposed on the upper face of the semiconductor chip 150. In the present embodiment, an adhesive member may be interposed between the lower face 112 of the electromagnetic shielding member 110 and the upper face of the semiconductor chip 150. The electromagnetic shielding member 110 is positioned on the upper face of the semiconductor chip 150 such that the bonding pads 152 of the semiconductor chip 150 are not covered by the electromagnetic shielding member 110 and are thus exposed to the outside.

The substrate 160 may have, for example, the shape of a plate. Connection pads 162 are disposed on an upper face of the substrate 160 and a ball land pattern 164 electrically connected with the connection pad 162 is formed on a lower face of the substrate 160, which is opposite to the upper face. The lower face of the semiconductor chip 150 is attached on the upper face of the substrate 160.

The conductive wire 170 electrically couples corresponding bonding pads 152 of the semiconductor chip 150 and the connection pads 162 of the substrate 160.

The molding member 180 covers the semiconductor chip 150, the electromagnetic member 110, and the RFID chip 140. The molding member 180 may contain, for example, a molding resin such as an epoxy resin. Although it should be understood that the molding member 180 is not limited in this way.

Figure 7:
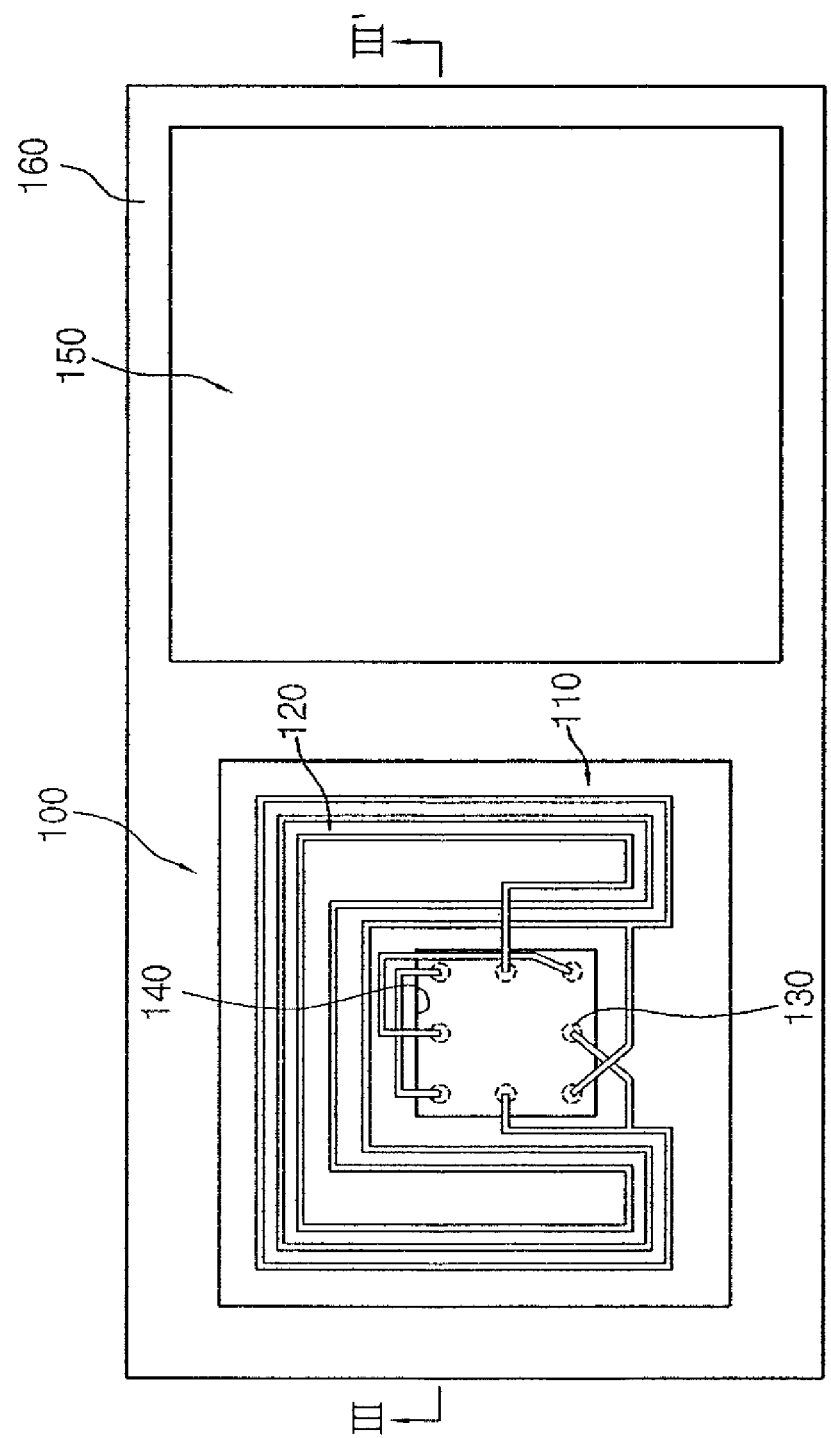
FIG. 7 is a plan view showing a semiconductor package in accordance with further another embodiment of the present invention.
Figure 8:
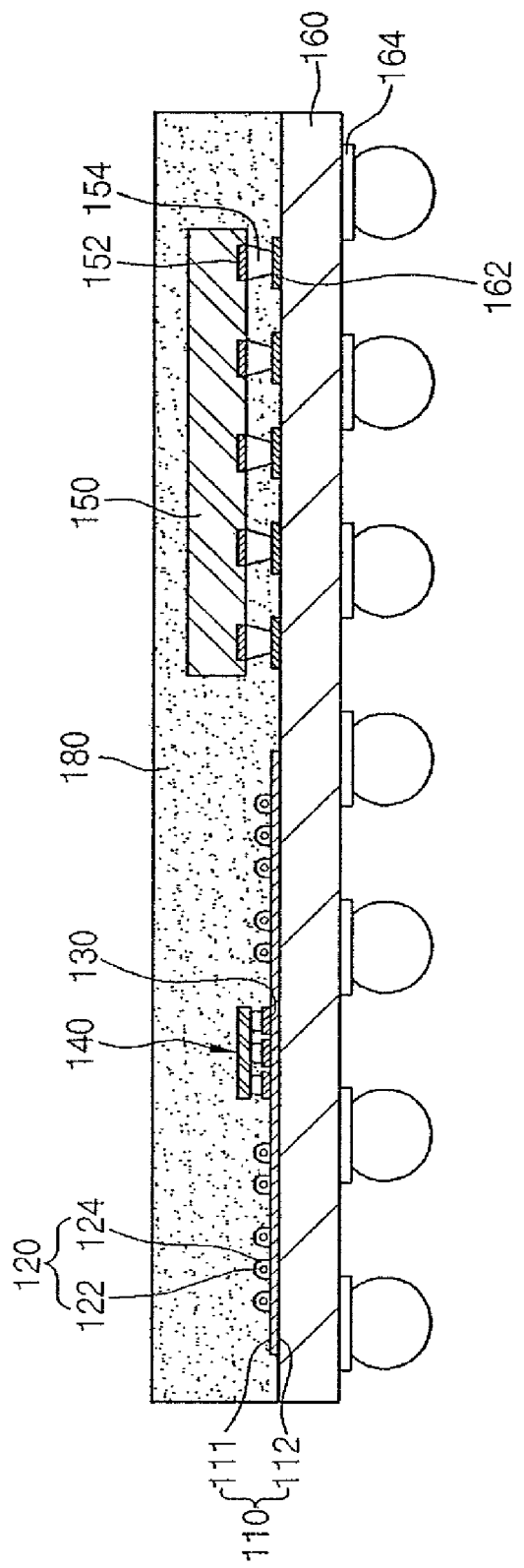
FIG. 8 is a cross-sectional view of the semiconductor package of FIG. 7 taken along a line III-III'.

FIG. 7 is a plan view showing a semiconductor package in accordance with further another embodiment of the present invention. FIG. 8 is a cross-sectional view taken along a line in FIG. 7.

Referring to FIGS. 7 and 8, the semiconductor package 100 includes the electromagnetic shielding member 110, the antenna 120, the ball lands 130, the RFID chip 140, the semiconductor chip 150, the substrate 160, the conductive wire 170, and the molding member 180. In the present embodiment, the electromagnetic shielding member 110, the antenna 120, the ball land 130, and the RFID chip 140 have the same structure as those described above with reference to FIGS. 1 through 4 and thus will not be described again. Further, identical numerals and names will be given to the identical parts.

The semiconductor chip 150 has, for example, a rectangular parallelepiped shape, and bonding pads 152 are disposed on the upper face of the semiconductor chip 150 having a rectangular parallelepiped shape. Connection members 154 are electrically connected to the bonding pads 152, respectively. The connection member 154 can be, for example, a solder ball or a bump. It should be noted that this is by way of example and the connection member 154 is not limited in this way.

The substrate 160 has a plate shape and connection pads 162 are disposed on the upper face thereof. In the present embodiment, the connection pads 162 are disposed, for example, in positions corresponding to the connection members 154 of the semiconductor chip 150 and the connection members 154 are electrically connected with the connection pads 162, respectively. A ball land pattern 164 electrically connected with the connection pad 162 is formed on a lower face of the substrate 160 opposite to the upper face.

In the present embodiment, the semiconductor chip 150 is disposed in a position shifted towards an edge of the substrate 160 such that the semiconductor chip 150 is side from the middle of the substrate 160.

The lower face 112 of the electromagnetic shielding member 110 having the ball lands 130, the antenna 120 electrically connected to the ball lands 130 and the RFID chip 140 connected to the ball lands 130 is disposed on the upper face of the substrate 160. In the present embodiment, an adhesive member may be interposed between the lower face 112 of the electromagnetic shielding member 110 and the upper face of the substrate 160. In the present embodiment, the electromagnetic shielding member 110 is disposed substantially parallel to the semiconductor chip 150.

The molding member 180 covers the semiconductor chip 150, the electromagnetic member 110, and the RFID chip 130. The molding member 180 can contain, for example, a molding resin such as an epoxy resin.

Figure 9:
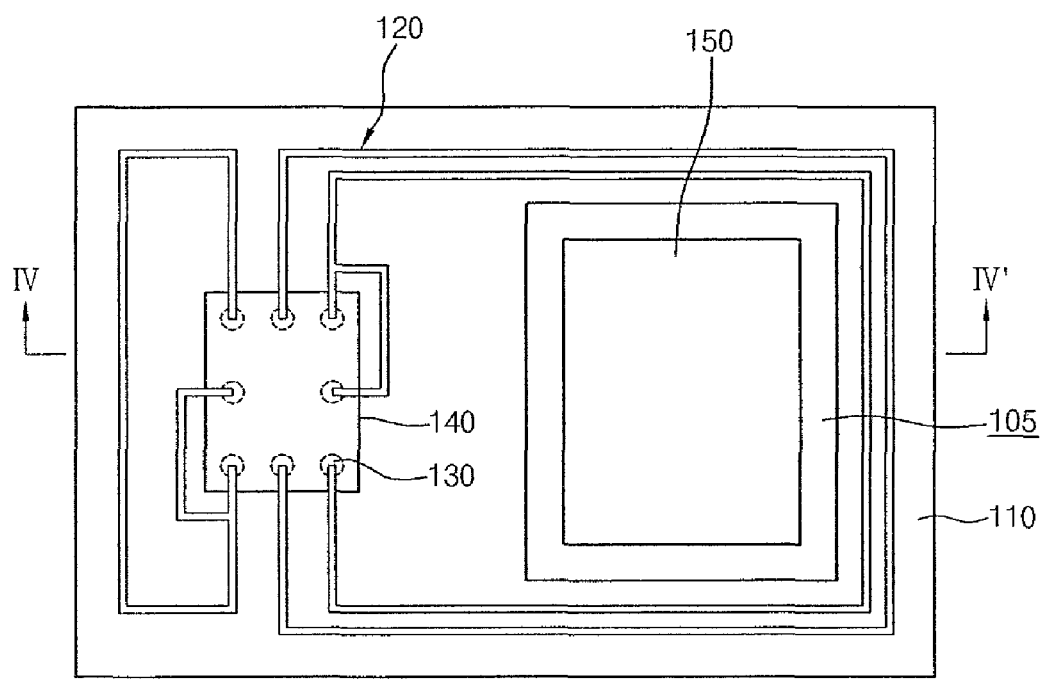
FIG. 9 is a plan view showing a semiconductor package in accordance with another embodiment of the present invention.
Figure 10:
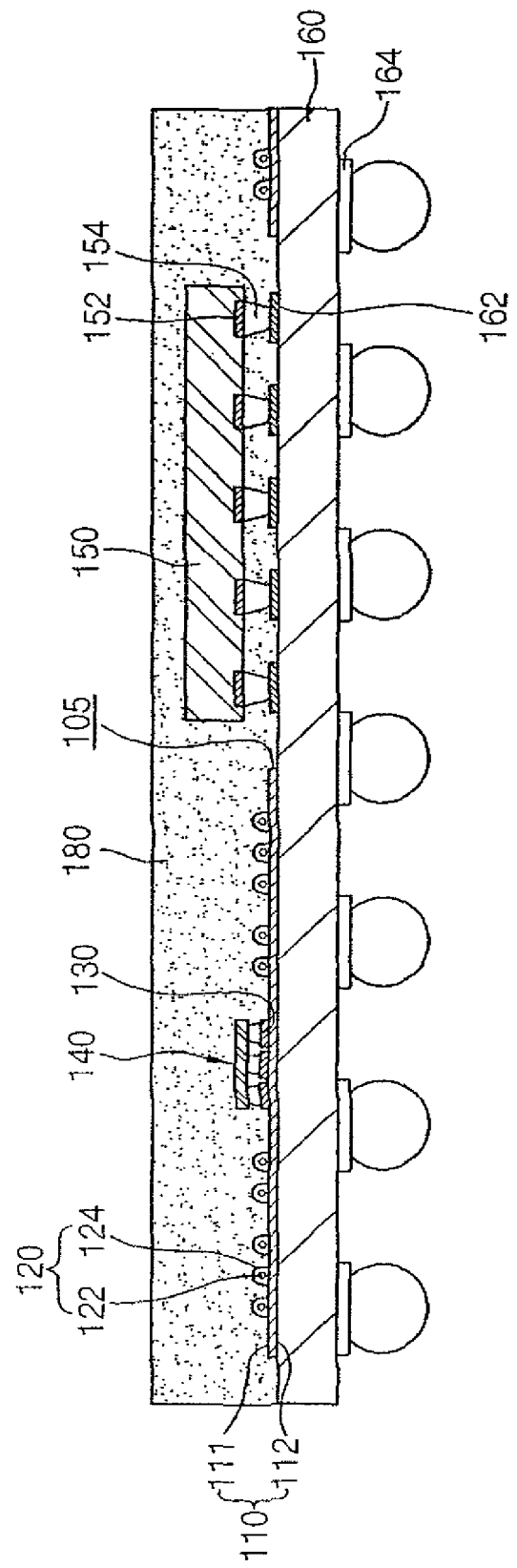
FIG. 10 is a cross-sectional view of the semiconductor package of FIG. 9 taken along a line IV-IV'.

FIG. 9 is a plan view showing a semiconductor package in accordance with another embodiment of the present invention. FIG. 10 is a cross-sectional view taken along a line IV-IV' in FIG. 9. In the present embodiment, the antenna 120, the ball lands 130, and the RFID chip 140 have substantially the same structure as those described above with reference to FIGS. 7 and 8 and thus will not be described again. Further, identical numerals and names will be given to the identical parts.

Referring to FIGS. 9 and 10, the semiconductor package 100 includes the electromagnetic shielding member 110, the antenna 120, the ball lands 130, the RFID chip 140, the semiconductor chip 150, the substrate 160, and the molding member 180.

The semiconductor chip 150 has, for example, a rectangular parallelepiped shape, and bonding pads 152 are disposed on the upper face of the semiconductor chip 150 having a rectangular parallelepiped shape. The connection members 154 are electrically coupled to the bonding pads 152, respectively. The connection member 154 can be, for example, a solder ball, bump, or the like.

The substrate 160 has a plate shape and the connection pads 162 are disposed on an upper face of the substrate 160. In the present embodiment, the connection pads 162 are disposed, for example, in positions corresponding to the connection members 154 of the semiconductor chip 150 and the connection members 154 are electrically connected with the connection pads 162, respectively. A ball land pattern 164 electrically connected with the connection pad 162 is formed on a lower face of the substrate 160 opposite to the upper face.

In the present embodiment, the semiconductor chip 150 is disposed such that the semiconductor chip 150 is positioned between one side of the substrate 160 and the middle of the substrate 160.

The lower face 112 of the electromagnetic shielding member 110 having the ball lands 130, the antenna 120 electrically connected to the ball lands 130, and the RFID chip 140 connected to the ball lands 130 is disposed on the upper face of the substrate 160. In the present embodiment, an adhesive member may be interposed between the lower face 112 of the electromagnetic shielding member 110 and the upper face of the substrate 160. In the present embodiment, the electromagnetic shielding member 110 may be formed to have the same size as that of the upper face of the substrate 160, and may be formed to include an opening 105 exposing the semiconductor chip 150 such that the semiconductor chip 150 is exposed to the outside through the opening 105.

The antenna 120 is disposed on the upper face 111 of the electromagnetic shielding member 110 around the semiconductor chip 150 and thus the surface area of the antenna 120 can be more increased.

The molding member 180 covers the semiconductor chip to 150, the electromagnetic member 110, and the RFID chip 140. The molding member 180 may contain, for example, a molding resin such as an epoxy resin. Although it should be understood that the molding member 180 is not limited herein.

Figure 11:
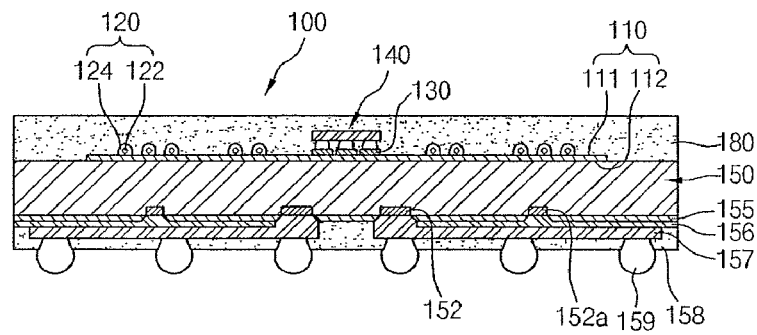
FIG. 11 is a plan view showing a semiconductor package in accordance with further another embodiment of the present invention.

FIG. 11 is a plan view showing a semiconductor package in accordance with another embodiment of the present invention. In the present embodiment, the electromagnetic shielding member, the antenna, the ball lands, and the RFID chip have substantially the same structure as those described above with reference to FIGS. 1 through 4 and thus will not be described again. Further, identical numerals and names will be given to the identical parts.

Referring to FIG. 11, the semiconductor package 100 includes the electromagnetic shielding member 110, the antenna 120, the ball lands 130, the RFID chip 140, the semiconductor chip 150, and the molding member 180.

The semiconductor chip 150 includes fuse boxes 152a, the bonding pads 152, a first insulation film 155, a second insulation film 156, redistributions 157, a third insulation film 158, and a connection member 159.

The fuse boxes 152a and the bonding pads 152 are disposed in a middle portion of the lower face of the semiconductor chip 150.

The first insulation film 155 covers the lower face of the semiconductor chip 150 and openings are defined in first insulation to film 155 for exposing the fuse boxes 152a and the bonding pads 152.

The second insulation film 156 is disposed on the first insulation film 155 and the fuse boxes 152a, and openings are defined in the second insulation film 156 to expose the bonding pads 152.

The redistributions 157 are disposed on the second insulation film 156 and the redistributions 157 are electrically coupled to the bonding pads 152 exposed by the openings defined in the first and second insulation films 155, 156. The redistributions 157 are formed to have a linear shape when viewed from the above.

The third insulation film 158 is disposed on the second insulation film 156, and openings are defined in the third insulation film 158 so as to expose portions of the redistribution 157.

The connection member 159 is electrically coupled to the redistribution 157 through the openings defined in the third insulation film 158.

The electromagnetic shielding member 110 having the antenna 120, which includes the antenna part 122 consisting of conductive polarized particles and the insulation part 124, the ball lands 130, which are electrically coupled to the antenna 120, and the RFID chip 140, which is electrically coupled to the ball lands 130 is disposed on the semiconductor chip 150. More particularly, the to lower face 112 of the electromagnetic shielding member is disposed on the upper face of the semiconductor chip, which is opposite the lower face of the semiconductor chip 150.

The molding member 180 covers the electromagnetic shielding member 110 and the RFID chip 140 disposed on the upper is face of the semiconductor chip 150.

The semiconductor package 100 further includes a plurality of RFID reader ball lands, a RFID reader, and a RFID reader antenna.

The RFID reader ball lands are disposed over the electromagnetic shielding member 110. The RFID reader is electrically connected to the RFID reader ball lands and communicates with an external RFID chip. The RFID reader antenna is electrically connected to the RFID reader ball lands.

Figure 12:
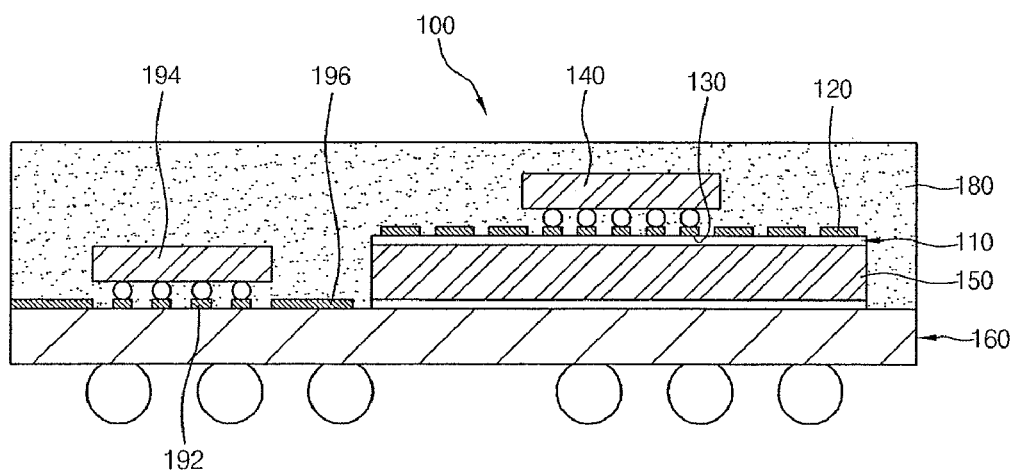
FIG. 12 is a cross-sectional view showing a semiconductor package in accordance with further another embodiment of the present invention.

FIG. 12 is a cross-sectional view showing a semiconductor package in accordance with another embodiment of the present invention. As shown in FIG. 12, the electromagnetic shielding member, the RFID chip, the RFID chip antenna, the semiconductor chip, the substrate, and the molding member have substantially the same structure as those described above with reference to FIG. 6 and thus will not be described again. Further, identical reference numerals and names will be given to the identical parts.

Referring to FIG. 12, the semiconductor package 100 includes the electromagnetic shielding member 110, the RFID chip antenna 120, RFID chip ball lands 130, the RFID chip 140, the semiconductor chip 150, the substrate 160, the molding member 180, a plurality of RFID reader ball lands 192, a RFID reader 194, and a RFID reader antenna 196.

The RFID reader ball lands 192 are disposed over an upper face of the substrate 160. The RFID reader ball lands 192 are electrically connected to the semiconductor chip 150 using the substrate 160. The RFID reader ball lands 192 are electrically connected to bonding pads of the RFID reader 194.

As shown in FIG. 12, the RFID reader antenna 196 is disposed over the substrate 160. The RFID reader antenna 196 has a closed loop shape when viewed from above, and the RFID reader antenna 196 is electrically connected to the RFID reader ball lands 192.

In the present embodiment, the RFID reader antenna 196 have substantially the same structure and are formed through substantially the same method as described above with reference to FIG. 6.

Figure 13:
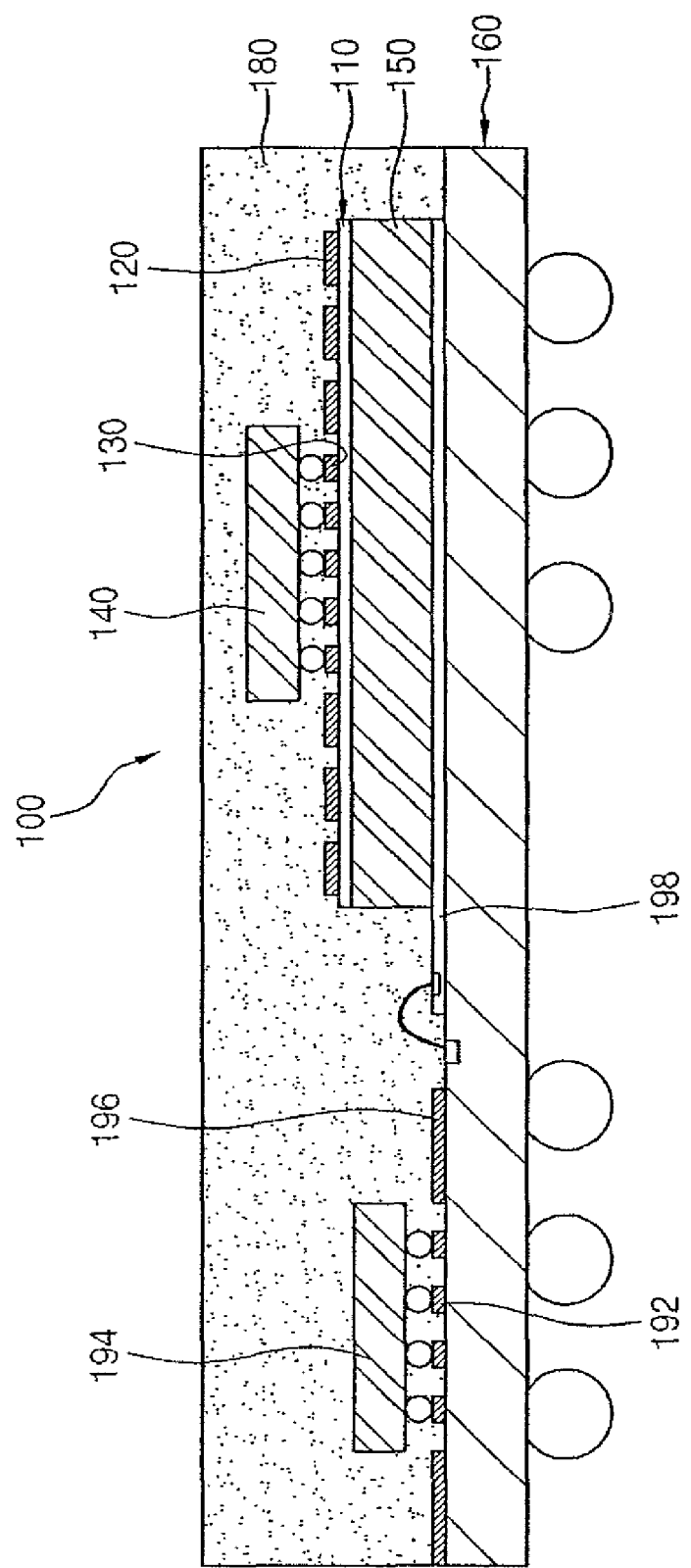
FIG. 13 is a cross-sectional view showing a thin secondary cell disposed in the semiconductor package in FIG. 12.

FIG. 13 is a cross-sectional view showing a thin secondary cell disposed in the semiconductor package.

Referring to FIG. 13, the RFID reader 194 is electrically connected to the RFID reader ball land 192. The RFID reader 194 is in communication with an external RFID chip that is positioned outside the semiconductor package.

The semiconductor package in FIG. 13 further includes a thin secondary cell that can be rechargeable. According to an embodiment of the present invention, the thin secondary cell 198 is interposed between the semiconductor chip 150 and the substrate is 160. Alternatively, the thin secondary cell 198 may be disposed over an upper face of the semiconductor chip 150. The thin secondary cell 198 has a plate shape.

According to an embodiment of the present invention, the thin secondary cell 198, which can be rechargeable, applies power for driving the RFID reader 194 and/or the RFID chip.

The present embodiment is adapted to the semiconductor package having the substrate; however, alternatively, the RFID chip and/or the RFID reader of the semiconductor package may be electrically connected to a read frame. For example, an RFID reader and/or an RFID chip may be disposed on a die pad of a read frame and/or an inner lead of the read frame. Alternatively, the RFID reader and/or the RFID chip may be disposed below the die pad and/or the inner lead of the lead frame.

Hereinafter, a method for fabricating a semiconductor package in accordance with an embodiment of the present invention will be described with reference to accompanying drawings.

FIGS. 14 through 22 are cross-sectional views and plan views shown for illustrating a method for fabricating a semiconductor package in accordance with an embodiment of the present invention.

Figure 14:
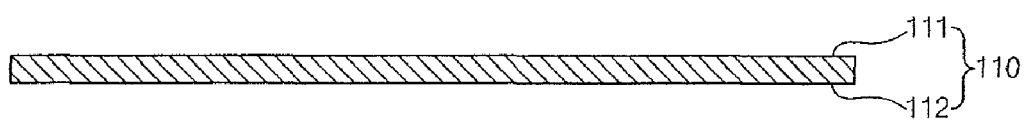
FIGS. 14 through 22 are cross-sectional views and plan views shown for illustrating a method for fabricating a semiconductor package in accordance with an embodiment of the present invention.

Referring to FIG. 14, an electromagnetic shielding member 110 is formed of an insulation material adapted to shield electromagnetic waves. The electromagnetic shielding member 110 has a plate shape with an upper face 111 and a lower face 112 opposite the upper face 111.

Figure 15:
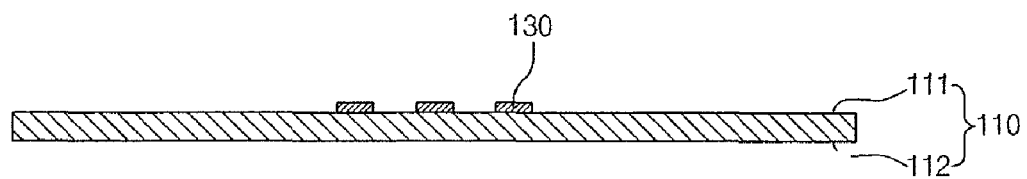

Referring to FIG. 15, RFID chip ball lands 130 are formed on the upper face 111 of the electromagnetic shielding member 110, and the RFID chip ball lands 130 may be formed by disposing a metal film on the upper face 111 of the electromagnetic shielding member 110 and then patterning the metal film. Alternatively, the RFID chip ball lands 130 may be formed through a plating process. In the present embodiment, the RFID chip ball lands 130 are formed in an island shape on the electromagnetic shielding member 110.

Figure 16:
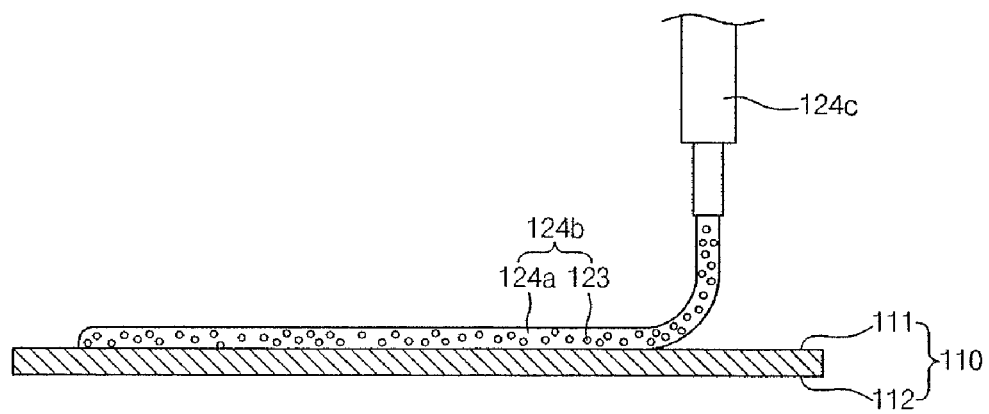
Figure 17:
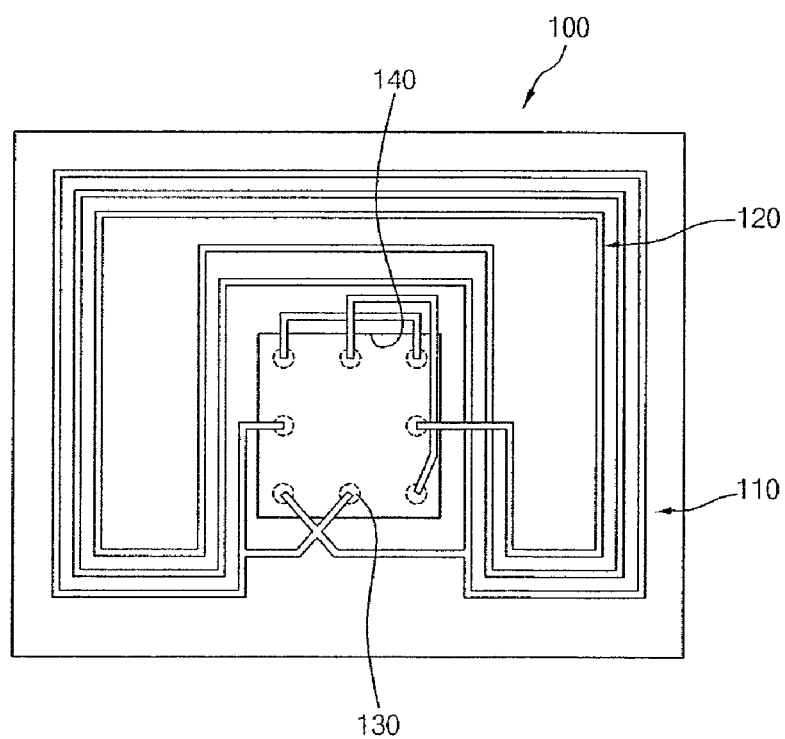

Referring to FIGS. 16 and 17, after the ball lands are formed over the electromagnetic shielding member 110, a flowable mixture solution including a mixture of flowable insulation material 124a and conductive particles 123 mixed is disposed on the electromagnetic shielding member 110 through a dispenser 124c to form a preliminary antenna 124b having a linear shape on the electromagnetic shielding member 110. A first end of the preliminary antenna 124b is formed to overlap with one of the RFID chip ball lands 130 and a second end opposite to the first end of the preliminary antenna 124b is formed to overlap with another one of the RFID chip ball lands 130.

Referring to FIG. 16, in the present embodiment, the is conductive particles 123 mixed in the preliminary antenna 124b may be a magnetorheological material where a conductive particle 123 has a first polarity and a second polarity opposite to the first polarity.

Figure 18:
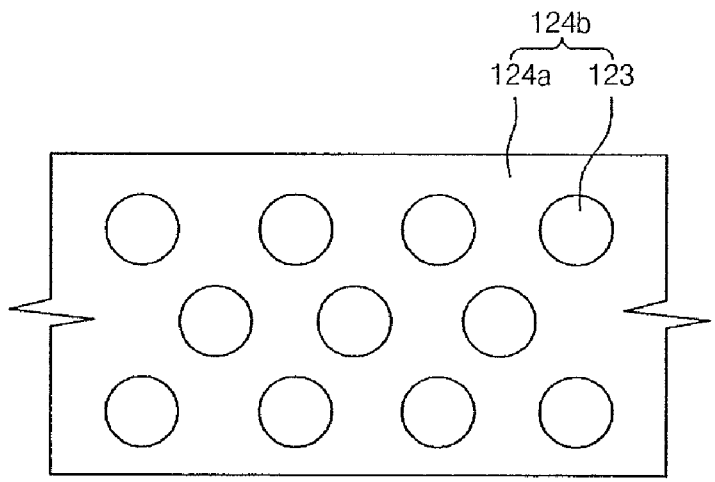

Referring to FIG. 18, when the conductive particles 123 are of a magnetorheological material, a magnetic field is applied to the preliminary antenna 124b by an N pole magnet and an S pole magnet and the conductive particles contained in the preliminary antenna 124b come to have the S polarity and the N polarity together.

Figure 19:
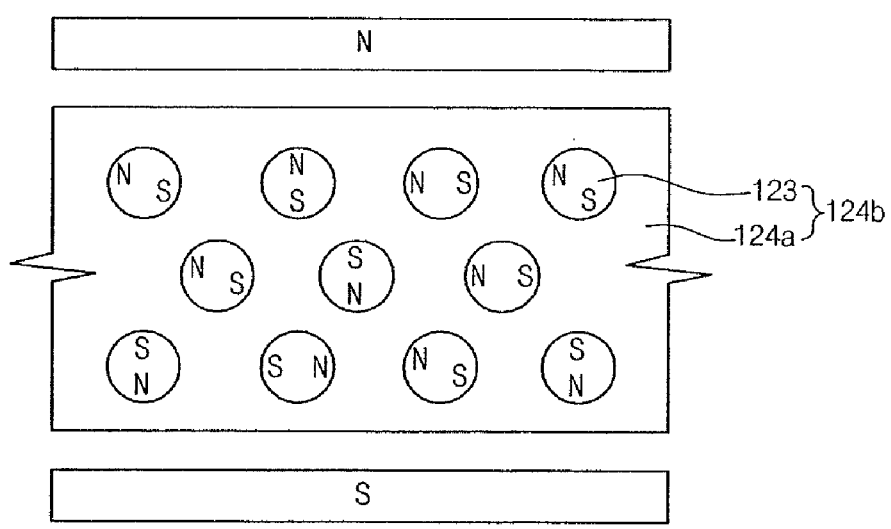

Referring to FIG. 19, after the conductive particles having the S polarity and the N polarity are formed, power of different polarities is applied to the respective ball lands 130, and the conductive particles 123 including the S polarity and the N polarity are connected with each other to form the antenna part 122 in such a manner that opposite polarities thereof are connected to each other within the flowable insulation material 124b, and the flowable insulation material 124 is cured to form the insulation part 124 fixing the antenna part 122 to the desired position.

Figure 20:
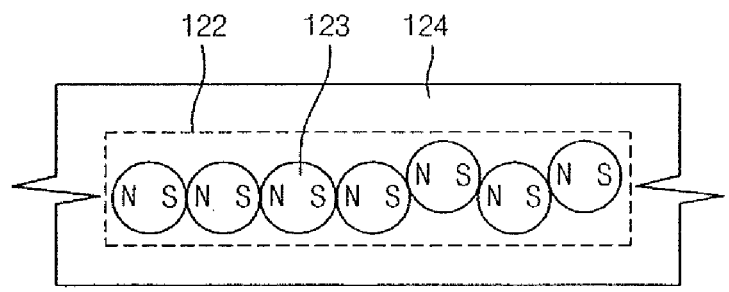
Figure 21:
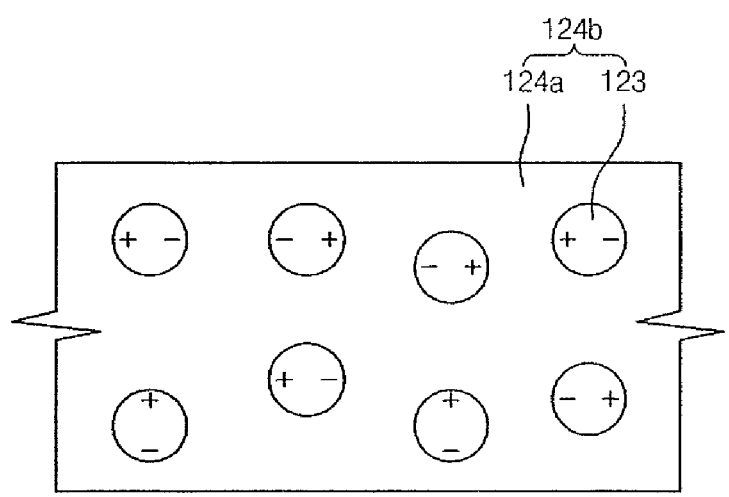
Figure 22:
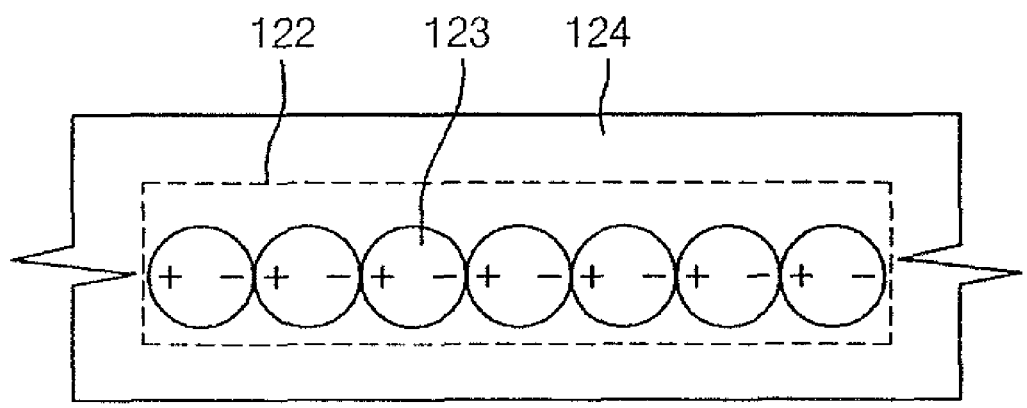

Referring to FIG. 20 when the conductive particles 123 are of an electrorheological material having (+) polarity and (−) polarity, opposite the (+) polarity, power of different polarities is applied to the respective RFID chip ball lands, the conductive particles 123 including the (+) polarity and the (−) polarity are connected with each other to form the antenna part 122 in such a manner that opposite polarities thereof are connected to each other within the flowable insulation material 124b, and the flowable insulation material 124b is cured to form the insulation part 124 which fixes the antenna part 122 to the desired position.

Subsequently, the RFID chip 140 is connected to the RFID chip ball land 130 via the connection member as shown in FIG. 2, thereby fabricating the semiconductor package 100.

In this embodiment, the RFID chip ball lands 130 disposed on the electromagnetic shielding member 110 are described or illustrated prior to forming the molding member 180; however, it is allowed, according to embodiments of the present invention, that the RFID reader antenna 196 is formed over the substrate 160 and/or the electromagnetic shielding member 110, an RFID reader antenna is formed on the RFID reader ball land 192, and the RFID reader 194 is electrically connected to the RFID reader ball land 192.

Further, a thin secondary cell that applies a power to the RFID reader and/or RFID chip may be formed among the to substrate, the semiconductor chip, and the electromagnetic shielding member in the course of the manufacturing the semiconductor package.

In the present embodiment, the semiconductor package shown in FIG. 2 can be disposed on another semiconductor is package. For example, the semiconductor package shown in FIG. 2 can be disposed on a semiconductor chip of another semiconductor package. Alternatively, the semiconductor package shown in FIG. 2 can be mounted on a substrate of another semiconductor package on which a semiconductor chip of another semiconductor package is mounted. Furthermore, the semiconductor package shown in FIG. 2 can be mounted on a semiconductor package having various structures. For example, the semiconductor package has a lead frame having a die pad and an inner lead. The RFID reader, the RFID reader antenna, and the thin secondary cell are electrically connected to the die pad and/or the inner lead of the lead frame.

As is apparent from the above description, according to embodiments of the present invention the size of the antenna can be reduced and the fabrication processes of the antenna can be reduced by forming the antenna, which is essential to the RFID chip, using a plurality of polarized particles.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A method for fabricating a semiconductor package, comprising:
   preparing an electromagnetic shielding member for shielding electromagnetic waves;
   forming RFID chip ball lands on the electromagnetic shielding member;
   forming a preliminary antenna connecting the RFID chip ball lands on an upper face of the electromagnetic shielding member, wherein the preliminary antenna comprises conductive polarized particles respectively having different polarities and a flowable insulation material;
   applying power having different polarities to the respective RFID chip ball lands so as to electrically connect the conductive polarized particles within the flowable insulation material;
   curing the flowable insulation material;
   electrically connecting terminals of an RFID chip to the respective RFID chip ball lands;
   attaching the electromagnetic shielding member to the semiconductor package; and
   molding the RFID chip of the electromagnetic shielding member and the semiconductor package with a molding member.

2. The method of claim 1, wherein in the step of attaching the electromagnetic shielding member to the semiconductor package, the electromagnetic shielding member is attached onto the semiconductor chip included in the semiconductor package or a substrate.

3. The method of claim 1, further comprising:
   forming a plurality of RFID reader ball lands on at least one of the electromagnetic shielding member and the substrate;
   electrically connecting the RFID reader ball lands to an RFID reader for communicating with an external RFID chip positioned outside the semiconductor chip;
   forming an RFID reader antenna electrically connected to the RFID reader ball lands.

4. The method of claim 3, further comprising:
   forming a thin secondary cell between the substrate and the semiconductor chip.

* * * * *